(12) United States Patent
Kim et al.

(10) Patent No.: US 9,418,333 B2
(45) Date of Patent: Aug. 16, 2016

(54) SYNAPSE ARRAY, PULSE SHAPER CIRCUIT AND NEUROMORPHIC SYSTEM

(71) Applicants: SAMSUNG ELECTRONICS CO., LTD., Suwon-si (KR); POSTECH ACADEMY-INDUSTRY FOUNDATION, Pohang-si (KR)

(72) Inventors: Jun Seok Kim, Hwaseong-si (KR); Jae Yoon Sim, Pohang-si (KR); Hyun Surk Ryu, Hwaseong-si (KR); Hwasuk Cho, Pohang-si (KR)

(73) Assignees: Samsung Electronics Co., Ltd., Suwon-si (KR); Postech Academy-Industry Foundation, Pohang-si (KR)

( * ) Notice: Subject to any disclaimer, the term of this patent is extended or adjusted under 35 U.S.C. 154(b) by 242 days.

(21) Appl. No.: 14/165,392

(22) Filed: Jan. 27, 2014

(65) Prior Publication Data

US 2014/0365416 A1    Dec. 11, 2014

(30) Foreign Application Priority Data

Jun. 10, 2013    (KR) .......................... 10-2013-0065669

(51) Int. Cl.
| | | |
|---|---|---|
| G06F 15/18 | (2006.01) | |
| G06N 3/08 | (2006.01) | |
| G06N 3/063 | (2006.01) | |
| G06N 3/04 | (2006.01) | |
| G11C 11/412 | (2006.01) | |

(52) U.S. Cl.
CPC ................ *G06N 3/063* (2013.01); *G06N 3/049* (2013.01); *G11C 11/412* (2013.01)

(58) Field of Classification Search
USPC ............................................................ 706/25
See application file for complete search history.

(56) References Cited

U.S. PATENT DOCUMENTS

| | | | |
|---|---|---|---|
| 4,874,963 A | 10/1989 | Alspector | |
| 5,704,014 A | 12/1997 | Marotta et al. | |
| 6,242,988 B1 | 6/2001 | Sarpeshkar | |
| 9,087,302 B2 * | 7/2015 | Sim ........................ | G06N 3/063 |

(Continued)

FOREIGN PATENT DOCUMENTS

| | | | |
|---|---|---|---|
| JP | 5-081229 A | 4/1993 | |
| JP | 5-108594 A | 4/1993 | |

(Continued)

OTHER PUBLICATIONS

A qualitative-modeling-based low-power silicon nerve membrane T. Kohno; K. Aihara Electronics, Circuits and Systems (ICECS), 2014 21st IEEE International Conference on Year: 2014 pp. 199-202, DOI: 10.1109/ICECS.2014.7049956 IEEE Conference Publications.*

(Continued)

*Primary Examiner* — Michael B Holmes
(74) *Attorney, Agent, or Firm* — NSIP Law

(57) ABSTRACT

A synapse array based on a static random access memory (SRAM), a pulse shaper circuit, and a neuromorphic system are provided. The synapse array includes a plurality of synapse circuits. At least one synapse circuit among the plurality of synapse circuits includes at least one bias transistor and at least two cut-off transistors, and the at least one synapse circuit is configured to charge a membrane node of a neuron circuit connected with the at least one synapse circuit using a sub-threshold leakage current that passed through the at least one bias transistor.

25 Claims, 5 Drawing Sheets

(56) References Cited

U.S. PATENT DOCUMENTS

| | | | |
|---|---|---|---|
| 9,104,974 B2 * | 8/2015 | Sim | G06N 3/049 |
| 2002/0025793 A1 * | 2/2002 | Meijer | H04B 7/0814 |
| | | | 455/277.1 |
| 2002/0167332 A1 | 11/2002 | Bernstein et al. | |
| 2005/0137993 A1 | 6/2005 | Poon | |
| 2009/0307165 A1 | 12/2009 | Zhang et al. | |
| 2012/0011088 A1 | 1/2012 | Aparin et al. | |
| 2012/0150781 A1 | 6/2012 | Arthur et al. | |
| 2012/0259804 A1 | 10/2012 | Brezzo et al. | |
| 2012/0317063 A1 * | 12/2012 | Sim | G06N 3/049 |
| | | | 706/27 |
| 2013/0031039 A1 * | 1/2013 | Sim | G06N 3/049 |
| | | | 706/26 |
| 2014/0258194 A1 * | 9/2014 | Towal | G06N 3/02 |
| | | | 706/15 |
| 2014/0330761 A1 * | 11/2014 | Kim | G06N 3/049 |
| | | | 706/25 |
| 2014/0358834 A1 * | 12/2014 | Kim | G06N 3/049 |
| | | | 706/25 |
| 2014/0365416 A1 * | 12/2014 | Kim | G06N 3/063 |
| | | | 706/25 |

FOREIGN PATENT DOCUMENTS

| | | |
|---|---|---|
| JP | 5-233586 A | 9/1993 |
| JP | 7-168901 A | 7/1995 |
| JP | 08-129540 A | 5/1996 |
| JP | 2003-223790 A | 8/2003 |
| WO | WO 2012/169726 A1 | 12/2012 |

OTHER PUBLICATIONS

Design of Dynamic Synapse Circuits with VLSI Design Approach A. D. Tete; A. Y. Deshmukh; P. Bajaj; A. G. Keskar Emerging Trends in Engineering and Technology (ICETET), 2010 3rd International Conference on Year: 2010 pp. 707-711, DOI: 10.1109/ICETET.2010.158 IEEE Conference Publications.*

SpiNNaker: A 1-W 18-Core System-on-Chip for Massively-Parallel Neural Network Simulation E. Painkras; L. A. Plana; J. Garside; S. Temple; F. Galluppi; C. Patterson; D. R. Lester; A. D. Brown; S. B. Furber IEEE Journal of Solid-State Circuits Yr: 2013, vol. 48, Issue: 8 pp. 1943-1953, DOI: 10.1109/JSSC.2013.2259038 IEEE Journals & Magazines.*

A simple electronic analog of the postsynaptic membrane: The NEUROBIOFET J. C. Dutta; T. Ahmed Devices, Circuits and Systems (ICDCS), 2012 International Conference on Year: 2012 pp. 670-672, DOI: 10.1109/ICDCSyst.2012.6188656 IEEE Conference Publications.*

Partial European Search Report issued Oct. 21, 2014 in counterpart European Application No. EP 14169845.6 (8 pages).

Indiveri, Giacomo, et al. "A VLSI array of low-power spiking neurons and bistable synapses with spike-timing dependent plasticity." Neural Networks, IEEE Transactions on 17.1 (2006): 211-221.

Seo, Jae-sun, et al. "A 45nm CMOS neuromorphic chip with a scalable architecture for learning in networks of spiking neurons." Custom Integrated Circuits Conference (CICC), 2011 IEEE. IEEE, 2011.

Christodoulou, C., et al. "The noisy-leaky integrator model implemented using pRAMs." Neural Networks, 1992. IJCNN., International Joint Conference on. vol. 1. IEEE, 1992.

Extended European Search Report issued Feb. 27, 2015 in counterpart European Applicaiton No. EP 14169845.6

* cited by examiner

FIG. 5
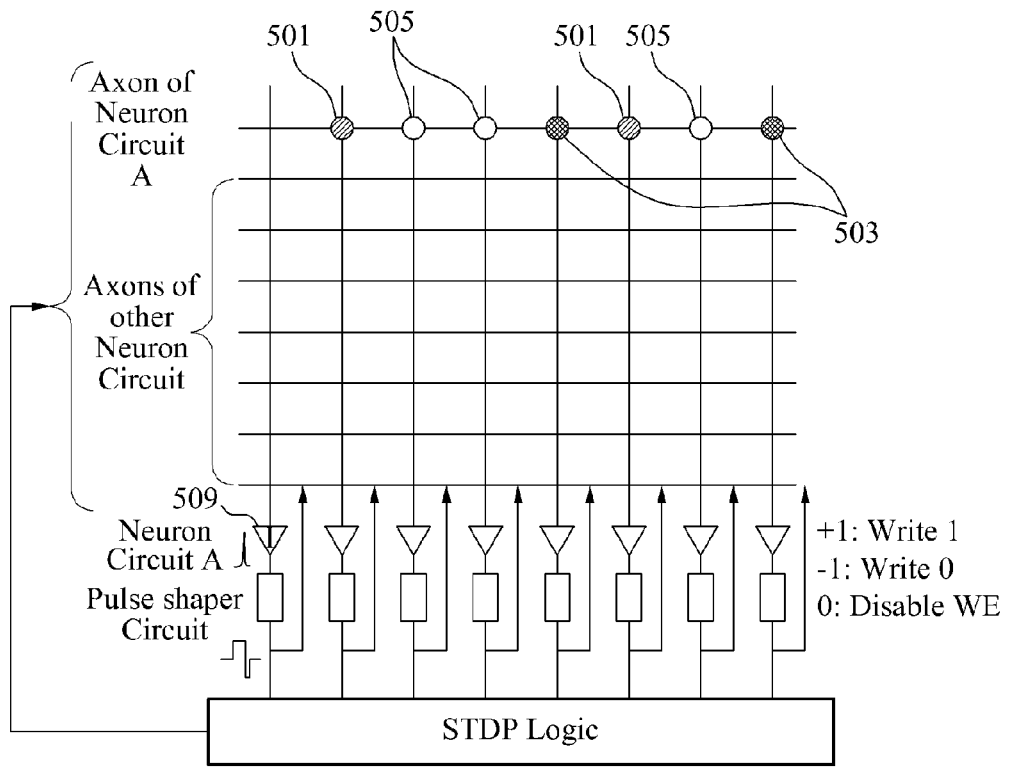
Case 1 : Potentiation
510
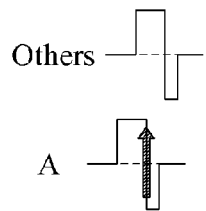
Case 2 : Depression
530
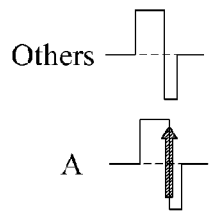
Case 3 : No Change
550
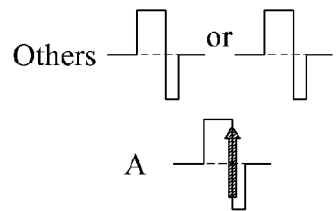

SYNAPSE ARRAY, PULSE SHAPER CIRCUIT AND NEUROMORPHIC SYSTEM

CROSS-REFERENCE TO RELATED APPLICATION(S)

This application claims the benefit under 35 USC 119(a) of Korean Patent Application No. 10-2013-0065669 filed on Jun. 10, 2013, in the Korean Intellectual Property Office, the entire disclosure of which is incorporated herein by reference for all purposes.

BACKGROUND

1. Field

The following description relates to a synapse array, a pulse shaper circuit, and a neuromorphic system that includes a synapse array and/or a pulse shaper circuit.

2. Description of Related Art

A physiological brain includes hundreds of billions of neurons that are interconnected with one another in a complicated nerve network. Neurons are considered to be responsible for the intellectual capability for learning and memory. In the cellular level, neurons use their synapses to exchange signals with thousands of other neurons. Thus, the neurons may be considered the structural and functional base units for data transmission. A synapse refers to a junction between two neurons at which an axon of a first neuron and a dendrite of a second neuron are positioned next to each other for transmission of data. A single neuron is generally connected with thousands of other neurons via synapses.

By manufacturing an artificial nervous system that mimics a biological nervous system in a neuronal level, a data processing method of the brain may be mimicked to achieve a new data processing and storing method.

A neuromorphic system refers to a semiconductor circuit that is designed to mimic the operation of the biological nervous system. A neuromorphic system may be used in a variety of applications, including in the implementation of an intelligent system that is capable of adapting itself to an unspecified environment.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a synapse array based on a static random access memory (SRAM), the synapse array including a plurality of synapse circuits, in which at least one synapse circuit among the plurality of synapse circuits includes at least one bias transistor and at least two cut-off transistors, and the at least one synapse circuit is configured to charge a membrane node of a neuron circuit connected with the at least one synapse circuit using a sub-threshold leakage current that passed through the at least one bias transistor.

The at least one synapse circuit may be configured to change a value of the SRAM using a leakage current that passed through the at least two cut-off transistors.

The neuron circuit may be configured to fire a spike based on a result of comparing a number of occurrences of oscillation pulses generated based on a voltage of the membrane node to a predetermined reference number.

The neuron circuit may include: a pulse generator configured to generate an oscillation pulse based on a voltage of the membrane node; a counter configured to count a number of occurrences of the oscillation pulse; and a comparator configured to compare the number of occurrences to a predetermined reference number.

The comparator may be configured to compare the reference number with the number of occurrences, in synchronization with a clock signal periodically input.

The neuron circuit may further include a transistor connected to a ground. The oscillation pulse may be used to reset the membrane node by activating the transistor.

The at least two cut-off transistors may include a first cut-off transistor and a second cut-off transistor. The first cut-off transistor may be connected to a power voltage for pull-up. The second cut-off transistor may be connected to a ground for pull-down. The at least one bias transistor may be connected to the membrane node of the neuron circuit connected with the at least one synapse circuit.

In another general aspect, there is provided a pulse shaper circuit that is configured to generate a digital pulse indicating whether pulses corresponding to spikes fired by a neuron circuit potentiate or depress a synaptic weight of a synapse circuit.

The general aspect of the pulse shaper circuit may further include: a finite impulse response (FIR) filter comprising a 1-bit D flip flop chain configured to store the pulses; a first OR calculator configured to generate the digital pulse by performing OR calculation with respect to at least one pulse corresponding to potentiation of the synaptic weight among the stored pulses; and a second OR calculator is configured to generate the digital pulse by performing OR calculation with respect to at least one pulse corresponding to depression of the synaptic weight among the stored pulses.

The pulse shaper circuit may be configured to generate the digital pulse for maintaining the synaptic weight based on a value of the first OR calculator and a value of the second OR calculator.

In another general aspect, there is provided a neuromorphic system including: a synapse array based on a SRAM, the synapse array including at least one synapse circuit; a neuron circuit connected with the synapse circuit, the synapse circuit being configured to charge a membrane node of the neuron circuit using a sub-threshold leakage current that passed through at least one bias transistor of the synapse array, and the neuron circuit being configured to fire spikes based on a voltage of the membrane node; and a pulse shaper circuit configured to generate a digital pulse corresponding to the fired spikes.

The synapse array may include a plurality of synapse circuits, the plurality of synapse circuits including the at least one synapse circuit. The neuromorphic system may include a plurality of neuron circuits and a plurality of pulse shaper circuits. The neuromorphic system may further include a spike-timing dependent plasticity (STDP) logic circuit configured to determine an update state of a synapse circuit among the plurality of synapse circuits and an updated value for the synapse circuit based on the digital pulse, and an encoder configured to access a synapse circuit to be updated according to the digital pulse.

The neuron circuit may be configured to fire spikes based on a result of comparing a number of occurrences of oscillation pulses generated based on the voltage of the membrane node to a predetermined reference number.

The synapse array may further include at least two cut-off transistors, and may be configured to change a value of the SRAM using a leakage current that passed through the at least two cut-off transistors.

The neuron circuit may include: a pulse generation unit configured to generate an oscillation pulse based on a voltage of the membrane node; a counter configured to count a number of occurrences of the oscillation pulse; and a comparator configured to compare the number of occurrences to a predetermined reference number.

The neuron circuit may further include a transistor connected to a ground. The oscillation pulse may be used to reset the membrane node by activating the transistor.

The at least two cut-off transistors may include a first cut-off transistor and a second cut-off transistor. The first cut-off transistor may be connected to a power voltage for pull-up. The second cut-off transistor may be connected to a ground for pull-down. The at least one bias transistor may be connected to the membrane node of the neuron circuit connected with the synapse circuit.

The pulse shaper circuits may be configured to generate a digital pulse indicating whether pulses corresponding to spikes fired by a neuron circuit potentiate or depress a synaptic weight of the synapse circuit.

The STDP logic circuit may be configured to determine an update state of the plurality of synapse circuits and an updated value for the synapse circuits based on whether the digital pulse potentiates or depresses the synaptic weight.

The STDP logic circuit may be configured to determine the update state and the updated value of the synapse circuits, depending on a spike time between digital pulses corresponding to the spikes fired by the plurality of neuron circuits.

The neuromorphic system may be configured to enable a write line (WL) of a synapse circuit corresponding to a first neuron circuit at a falling edge of a first digital pulse corresponding to a spike fired by the first neuron circuit in response to the first neuron circuit among the plurality of neuron circuits firing the spike.

The STDP logic circuit may be configured to determine the updated value of the synapse circuit corresponding to the first neuron circuit based on a value of a second digital pulse of a second neuron seen from the falling edge of the first digital pulse.

The STDP logic circuit may be configured to update a value for potentiating the synaptic weight as the updated value in response to the first digital pulse preceding the second digital pulse.

The STDP logic circuit may be configured to update a value for depressing the synaptic weight as the updated value in response to the second digital pulse preceding the first digital pulse.

The STDP logic circuit may be configured to determine to maintain the value of the synapse circuit corresponding to the first neuron circuit in response to '0' being detected at the falling edge of the first digital pulse.

The encoder may be configured to transmit the updated value to the synapse circuits according to the digital pulse.

Other features and aspects will be apparent from the following detailed description, the drawings, and the claims.

BRIEF DESCRIPTION OF THE DRAWINGS

FIG. 5 is a diagram illustrating an example of a spike-timing dependent plasticity (STDP) operation method of a neuromorphic system.

Figure 1:
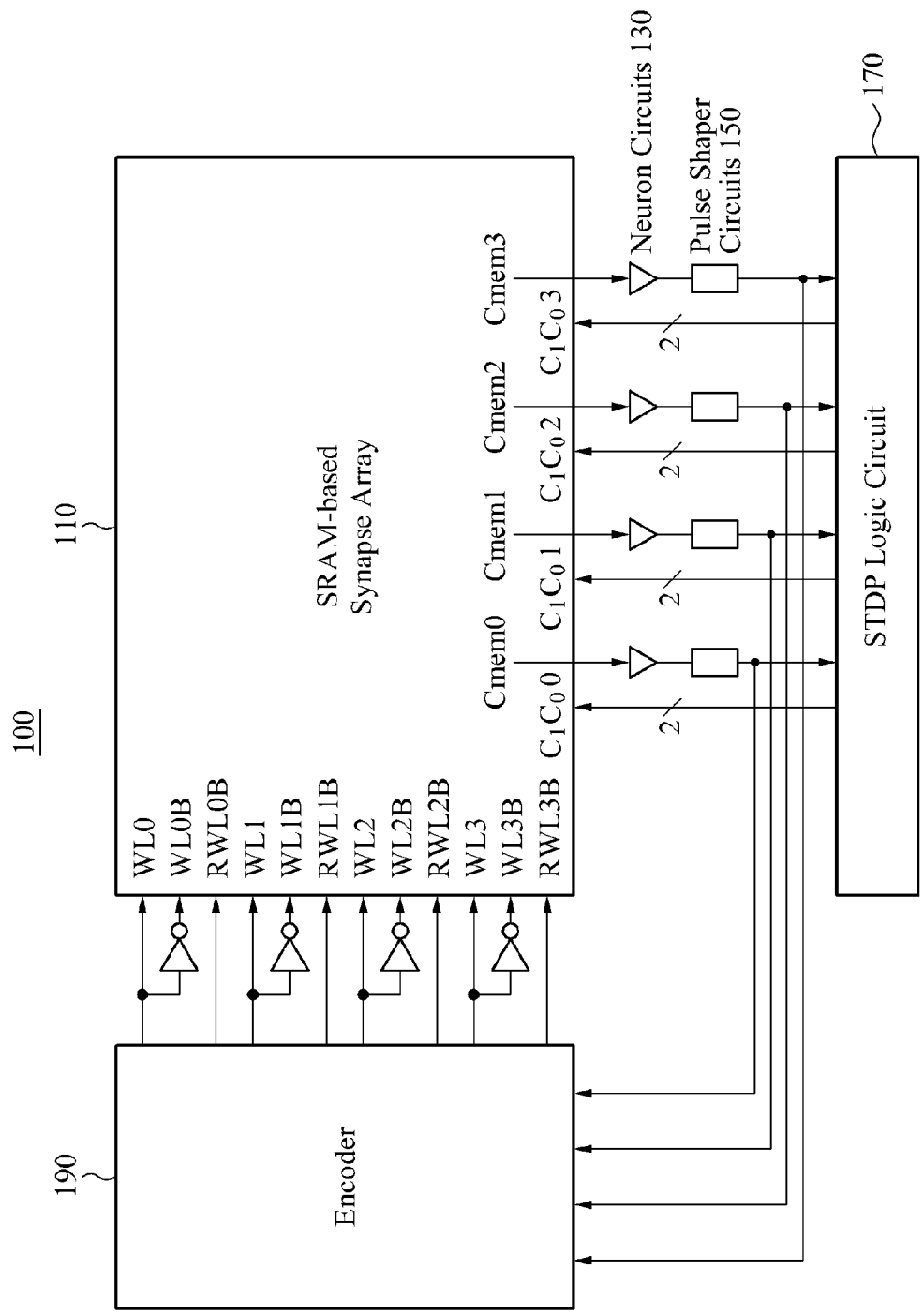
FIG. 1 is a diagram illustrating an overall structure of an example of a neuromorphic to system.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses, and/or methods described herein will be apparent to one of ordinary skill in the art. The progression of processing steps and/or operations described is an example; however, the sequence of steps and/or operations is not limited to that set forth herein and may be changed as is known in the art, with the exception of steps and/or operations necessarily occurring in a certain order. Also, description of well-known functions and constructions may be omitted to for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

FIG. 1 illustrates an overall structure of an example of a neuromorphic system 100.

Referring to FIG. 1, the neuromorphic system 100 includes a static random access memory (SRAM)-based synapse array 110, a plurality of neuron circuits 130, a plurality of pulse shaper circuits 150, a spike-timing dependent plasticity (STDP) logic circuit 170, and an encoder 190. However, in other examples, a neuromorphic system may include one or more of the SRAM-based synapse array, neurons circuits, pulse shaper circuits, STDP logic circuit and encoder, without including all of these structures.

Referring to FIG. 1, the SRAM-based synapse array 110 includes a plurality of synapse circuits based on an SRAM structure. Each of the synapse circuits may include at least one bias transistor and at least two cut-off transistors.

The synapse circuit may charge membrane nodes of the neuron circuits 130 that is connected with the synapse circuit, using a sub-threshold leakage current that passed through the at least one bias transistor. In addition, the synapse circuit may change a value of the SRAM by using a leakage current that passes through the at least two cut-off transistors.

The synapse circuit may include the at least two cut-off transistors, for example, a first cut-off transistor and a second cut-off transistor. The first cut-off transistor may be connected to a voltage drain drain (VDD) for pull-up. The second cut-off transistor may be connected to a ground (GND) for pull-down. The at least one bias transistor may be connected to the membrane nodes of the neuron circuits 130 that is connected to the synapse circuit.

WLx/WLxB indicated at the synapse array 110 refers to a word line, that is, a line for selecting an address of an axon. In WLx/WLxB, x refers to an order of each line. In this example, x may be a natural number ranging from 0 to 3. A logic value of WLx of the synapse array 110 is 1. When a corresponding line is selected, an STDP result may be used for the SRAM through $C_1C_0x$, that is, STDP information of each neuron transmitted through an STDP logic circuit. STDP refers to a learning mechanism postulated to exist in synapses of biological nerve networks. Based on STDP, synaptic efficacy or weight is slightly altered between two neurons based on information such as the timing of a pre-synaptic spike in a pre-synaptic neuron and a post-synaptic spike in a post-synaptic neuron. That is, a synaptic circuit may be potentiated or depressed to change the efficacy of data transmission between two neurons. The operation and configuration of an example of the synapse circuit are further described below with reference to FIG. 2.

The plurality of neuron circuits 130 may fire spikes based on a result of comparing a number of occurrences of oscillation pulses generated on the basis of an input voltage input from the membrane nodes, to a predetermined reference number. An example of the neuron circuit 130 is further described below with reference to FIG. 3.

The plurality of pulse shaper circuits 150 may receive a signal transmitted from the neuron circuit 130, and may generate a pulse for the STDP operation based on the signal. The pulse shaper circuits 150 may generate digital pulses corresponding to the spikes fired at the neuron circuits 130. The pulse shaper circuits 150 may generate the digital pulses that indicate whether pulses corresponding to the fired spikes potentiate (strengthen) or depress (weaken) a synaptic weight of the synapse circuit. An example of the pulse shaper circuit 150 is further described below with reference to FIG. 4.

The STDP logic circuit 170 may receive the signal generated by the pulse shaper circuits 150, and may perform the STDP operation based on the signal. That is, the STDP logic circuit 170 may determine an update state of the plurality of synapse circuits and updated values for the synapse circuits, based on the digital pulses generated by the pulse shaper circuits 150. In addition, the STDP logic circuit 170 may include an address event representation (AER) function, by which the STDP logic circuit 170 may transmit a test result related to the neuron circuits 130 and information regarding firing generated in a random neuron circuit 130 to other neuron circuits 130. The updated value determined by the STDP logic circuit 170 may be transmitted to the synapse array 110 through the WBLx line.

The STDP logic circuit 170 may determine the presence of absence of an updating event (update state) and the updated values of the synapse circuits, based on a spike time between the digital pulses corresponding to the spikes fired by the plurality of neuron circuits 130.

The operation of the STDP logic circuit 170 is further described below with reference to FIG. 5.

The encoder 190 may access the synapse array 110 according to the digital pulses generated by the pulse shapers 150. The encoder 190 may access the synapse arrays to be updated according to the digital pulses, or transmit the updated values to the synapse circuits according to the digital pulses. For example, in the event that a firing occurred in a neuron circuit 130, the pulse generated at a pulse shaper circuit 150, for example '1', may be transmitted to the encoder 190. In response, the encoder 190 may transmit a logic value '1' to WL0 to update the synaptic weight of the synapse circuit corresponding to the neuron circuit 130. In this example, the WL0 line (or other WLx line) refers to a line for selecting the address of a word line. That is, the WL0 line (or other WLx line) may correspond to a Write Enable state. In the event that WL0 is equal to '1', states of the synapse circuits corresponding to a first word line, for example, corresponding to an axon of neuron circuit A in FIG. 5 may be the Write Enable state. However, in the event that the neuron circuit 130 did not fire, the encoder 190 does not transmit the pulse and, in this state, the logic value '0' may be applied to WL2. Therefore, synapse circuits corresponding to a third word line may be in a Write Disable state and data may not be written.

For example, in the event that a first neuron circuit among the plurality of neuron circuits 130 fired the spike, the neuromorphic system may enable a write line, for example the WLX line, of the synapse circuit corresponding to the first neuron circuit in a falling edge of a first digital pulse corresponding to the fired spike.

Generally, the neuromorphic system may be greatly affected by a leakage current of devices, a mismatch between devices, and a process voltage temperature (PVT) variation. Further, with an increase in the number of neuron circuits and synapse circuits included in a neuromorphic system, more scale-down complementary metal oxide semiconductor (CMOS) process may be used for high integration. However, as the process becomes more scale-down, the leakage current from semiconductor components may further increase. The increase in leakage current may potentially cause continuous firings inside a neuron circuit even when no external stimulation is applied to the neuron circuit.

In general, leakage current has been considered an adverse side effect in designing a neuromorphic system. However, according to one example, the neuromorphic system may be implemented in such a way that it meets the demand for high integration and low power, by using a small amount of current equivalent to the amount of leakage current.

Figure 2:
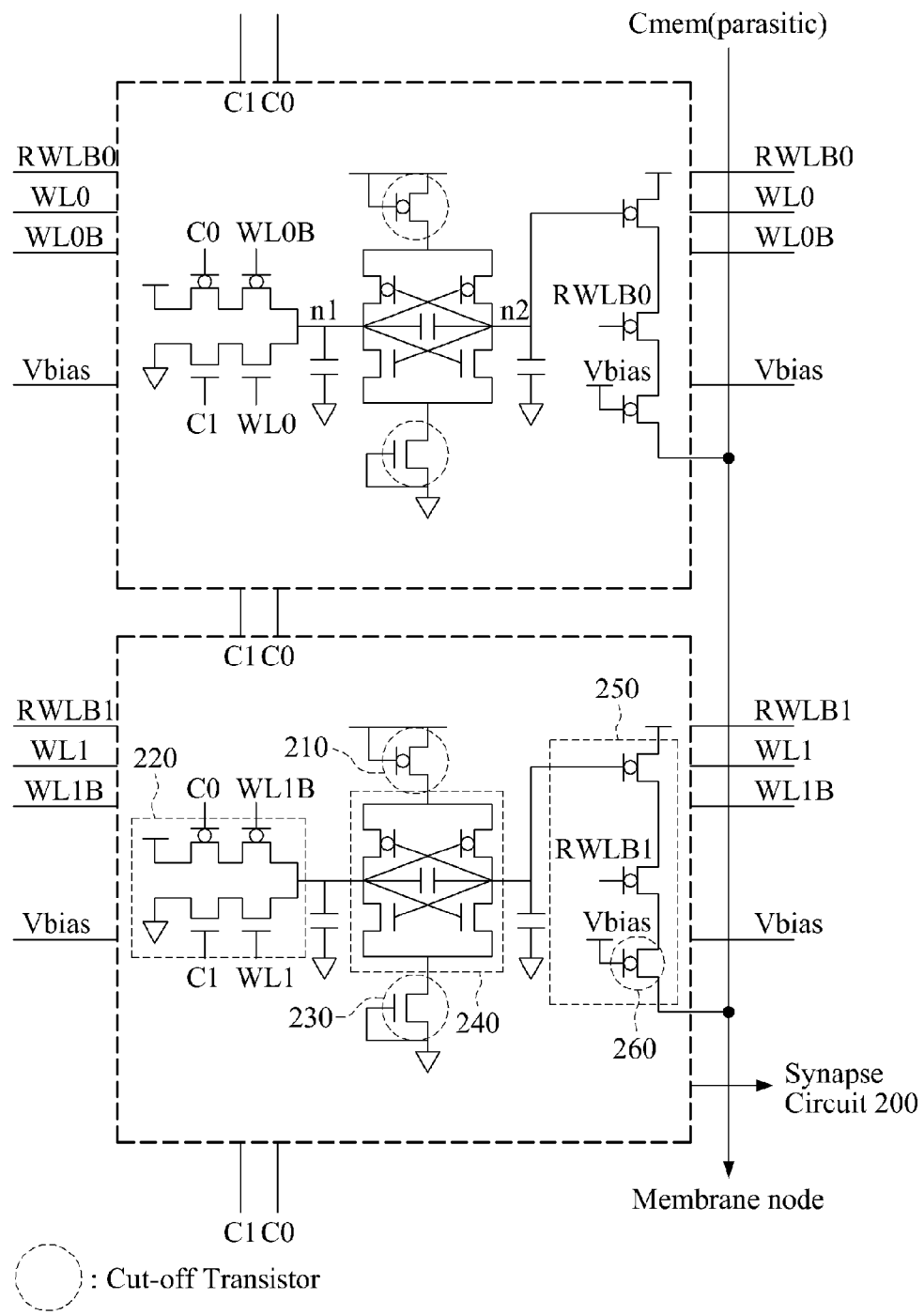
FIG. 2 is a diagram illustrating an example of a synapse circuit included in a neuromorphic system.

FIG. 2 illustrates an example of a synapse circuit 200 included in a neuromorphic system. The neuromorphic system may correspond to the neuromorphic system illustrated in FIG. 1. Further, according to another example, a synapse circuit may include only a portion of the structures illustrated in FIG. 2.

Referring to FIG. 2, the synapse circuit 200 includes at least two cut-off transistors 210 and 230, and at least one bias transistor 260.

The synapse circuit 200 is configured to charge a membrane node of a neuron circuit connected with the synapse circuit 200, using a sub-threshold leakage current that passed through the at least one bias transistor 260.

The at least two cut-off transistors 210 and 230 include a first cut-off transistor 210 and a second cut-off transistor 230.

In this example, the first cut-off transistor 210 is a P-metal oxide semiconductor (P-MOS) transistor. The first cut-off transistor 210 is connected to a power voltage VDD for pull-up. The second cut-off transistor 230 is an N-MOS transistor and is connected to a ground GND for pull-down.

The bias transistor 260 is a transistor located at a last position of a third device 250 in which three P-MOS transistors are serially connected. The bias transistor 260 may be connected to the membrane node of the neuron circuit connected to the synapse circuit 200. The third device 250 in which the three P-MOS transistors are serially connected may be connected to an RWLBx line and a Cmemx line. The third device 250 may be used in performing a read operation. In the event that firing occurs at a neuron circuit corresponding to the RWLBx line, all neuron circuits that are connected to the neuron circuit may have a logic value '1.'

While a write line WLx of the synapse circuit 200 is enabled, in this example, the synapse circuit 200 may change a value of the cross-coupled inverter 240 to a value provided by a writing circuit 220. At most time, the write line WLx is in a disabled state.

A neuromorphic system using a general SRAM structure may be implemented only with a cross-coupled inverter 240 configuration. In such a case, because a leakage current between the power voltage VDD and the ground GND, flowing through the cross-coupled inverter 240, may be great in amount, the leakage power consumption may increase.

However, the neuromorphic system according to the present disclosure may considerably reduce the leakage power consumption caused by the first cut-off transistor 210 and the second cut-off transistor 230. For example, when the first cut-off transistor 210 and the second cut-off transistor 230 are in an off state, the leakage current between the power voltage VDD and the ground GND may be substantially suppressed, thereby reducing the leakage power consumption.

In the event that a value of a node n1 is '0' in the cross-coupled inverter 240, the SRAM may have a value of approximately '0.' In the event that the value of the node n1 is '1,' the SRAM may have a value that is approximately '1' and a value of a node n2 may be approximately '0.' Therefore, the node n2 may allow the current that is necessary for operation to flow toward the membrane node. Here, a voltage slightly lower than the power voltage VDD may be applied to the bias transistor 260 located at the third position of the third device 250 through an external bias circuit. Accordingly, only a minor amount of current equivalent to the sub-threshold leakage current may flow inside the bias transistor 260.

In the event that firing occurs at the neuron circuit during a writing operation, it is possible for the current to flow among the neuron circuits in different directions according to whether the synaptic weight of the synapse circuit corresponds to potentiation or depression.

In the event that the synaptic weight is '1,' the current may flow from a pre-synaptic neuron circuit to a post-synaptic neuron circuit. Conversely, in the event that the synaptic weight is '−1,' the current may flow from a post-synaptic neuron circuit to a pre-synaptic neuron circuit.

In addition, a first device, that is, the writing circuit 220 including two serially connected N-MOS transistors and two serially connected P-MOS transistors may be connected to the WLx word line as a result of the STDP and therefore may perform the writing operation.

Referring back to the synapse circuit of FIG. 2, in the event that the transistor is turned on, a current of several nano amperes ($1\times10^{-9}$ A) may flow through the transistor. In the event that the transistor is in an OFF state, a current of several pico amperes ($1\times10^{-12}$ A) may flow through the transistor. The magnitudes of currents may be considered as a leakage current level of a general synapse circuit. According to one example, it is possible to operate the neuron circuit with such a small amount of current, thereby achieving a high level of integration and a reduction of power consumption in the neuromorphic system.

Because the synapse circuit according to the embodiment uses a synapse circuit based on the SRAM structure, the synapse circuit takes up a relatively small area and is efficient in achieving high integration. Moreover, the synapse circuit may charge the membrane node of the neuron with a small amount of current using the cut-off transistors. Therefore, even with a highly integrated circuit, a firing rate of the neuron circuit may be maintained at a level similar to an actual biological neuron.

Furthermore, due to the cut-off transistors that is connected to the power voltage VDD and the ground GND through pull-up and pull-down, a leakage current may not be generated even in a static state remembering the synaptic weight. Therefore, a neuromorphic system that operates with low power consumption may be achieved.

Figure 3:
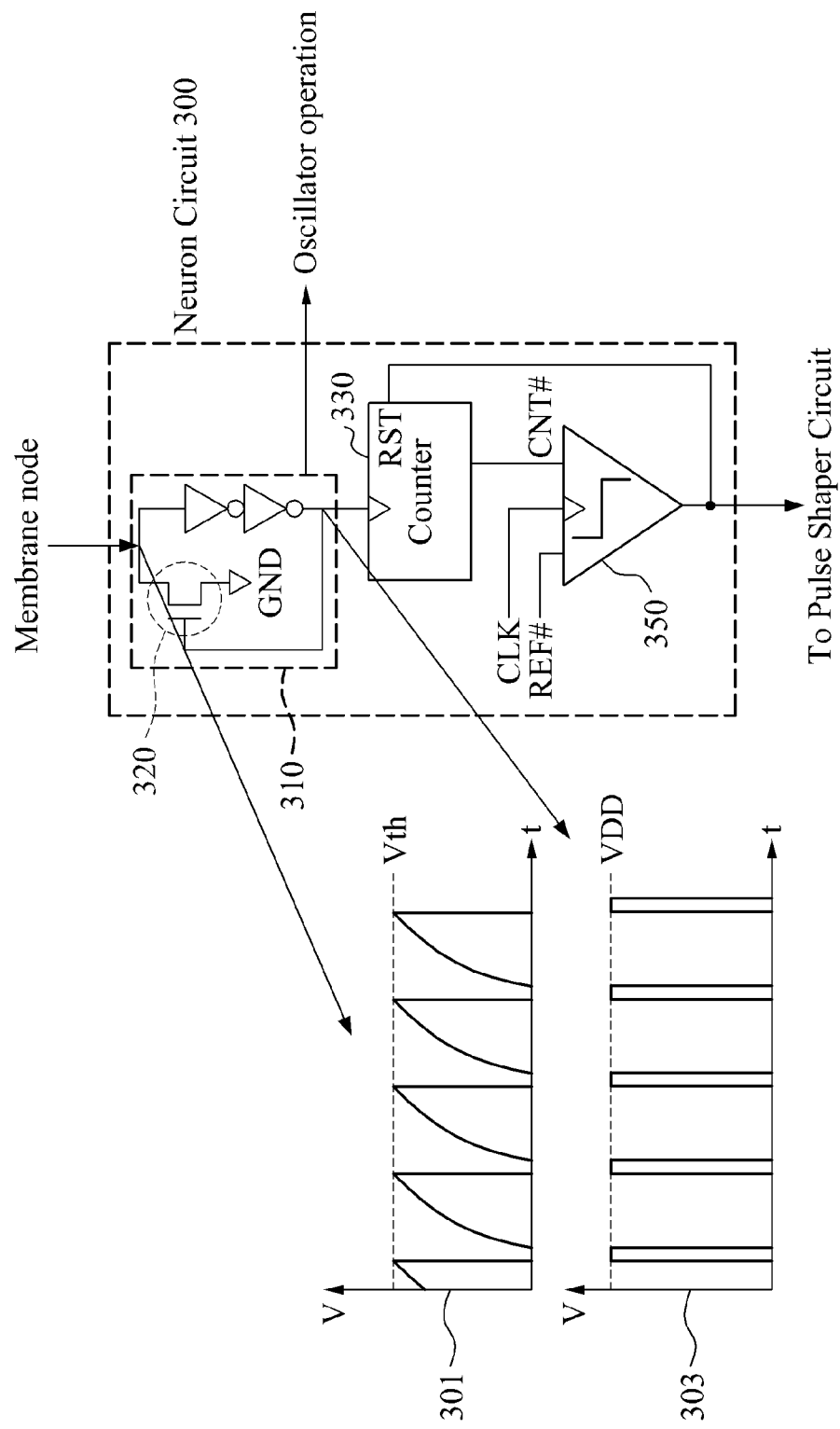
FIG. 3 is a diagram illustrating an example of a neuron circuit included in a neuromorphic system.

FIG. 3 illustrates an example of a neuron circuit 300 included in a neuromorphic system. The neuromorphic system may correspond to the neuromorphic system illustrated in FIG. 1. Further, according to another example, a neuron circuit may include only a portion of the structures illustrated in FIG. 3.

Referring to FIG. 3, the neuron circuit 300 according to one example includes a pulse generator 310, a counter 330, and a comparator 350.

In the event that a voltage is applied through a membrane node, the pulse generator 310 may generate an oscillation pulse based on the voltage. For example, the voltage applied to the pulse generator 310 may have a wave form similar to a wave form 301 illustrated in FIG. 3. The oscillation pulse generated by the pulse generator 310 may be a digital pulse similar to a wave form 303 illustrated in FIG. 3.

The pulse generator 310 includes a transistor 320. The transistor 320 connects to a ground GND through a source terminal thereof, and connects to the membrane node through a drain terminal thereof. The oscillation pulse generated by the pulse generator 310 may activate the transistor 320, thereby resetting the membrane node. By resetting the membrane node, the transistor 320 may participate in the generation of the oscillation pulse.

The counter 330 may count a number of occurrences of the oscillation pulses or a number of the oscillation pulses generated in the pulse generator 350.

The comparator 350 may compare a predetermined reference number with the number of occurrences of the oscillation pulses counted by the counter 330. The comparator 350 may compare the reference number with the number of occurrences, in synchronization with a clock signal that is periodically input.

The comparator 350 may fire a spike based on a result of the comparison. The pulse generated in the comparator 350 may be connected to a reset terminal of the counter 330 and be transmitted to a pulse shaper circuit. Here, the transmitted pulse may pass through a finite impulse response (FIR) filter and be overwritten to a synaptic weight of the synapse circuit by an STDP logic circuit.

Figure 4:
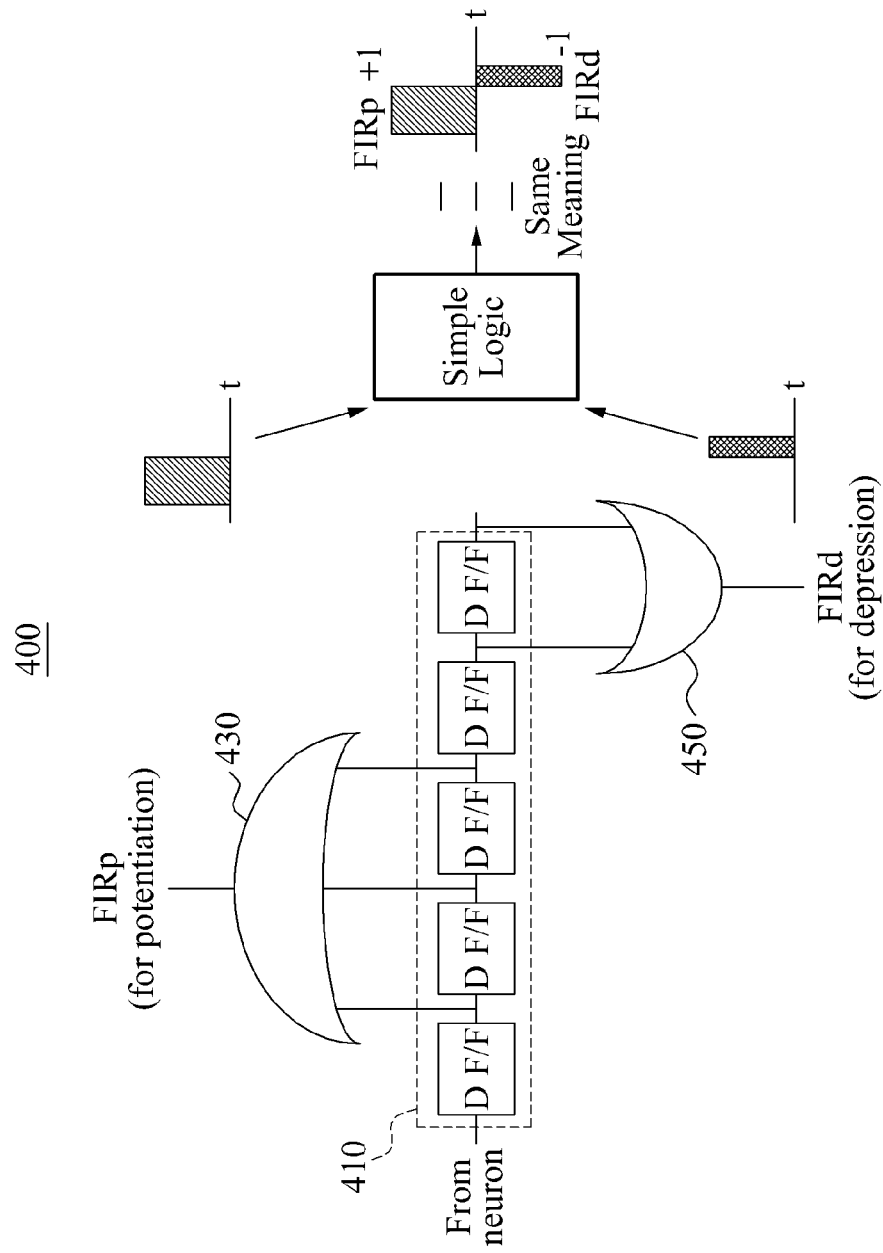
FIG. 4 is a diagram illustrating an example of a pulse shaper circuit included in a neuromorphic system.

FIG. 4 is a diagram illustrating an example of a pulse shaper circuit included in a neuromorphic system. The neuromorphic system may correspond to the neuromorphic system illustrated in FIG. 1. Further, according to another example, a pulse shaper circuit may include only a portion of the structures illustrated in FIG. 4.

Referring to FIG. 4, the pulse shaper circuit according to one example may form the shape of a neuron spike that is necessary for the STDP operation. That is, the pulse shaper circuit may generate a digital pulse indicating whether pulses corresponding to the spike fired to by the neuron circuit are to potentiate or depress the synaptic weight of the synapse circuit.

The pulse shaper circuit 400 includes a FIR filter 410, a first OR calculator 430, and a second OR calculator 450.

The FIR filter 410 may be in the form of a 1-bit D flip-flop chain and be configured to store pulses transmitted from the neuron circuit.

The first OR calculator 430 may generate the digital pulse by performing an OR calculation with respect to at least one pulse corresponding to potentiation of the synaptic weight among the pulses stored in the FIR filter 410.

The second OR calculator 450 may generate the digital pulse by performing OR calculation with respect to at least one pulse that corresponds to depression of the synaptic weight among the pulses stored in the FIR filter 410.

Output values of the first OR calculator 430 and the second OR calculator may express the synaptic weights of +1, 0, and −1 through simple calculation. For example, the output value '1(+1)' of the first OR calculator 430 may refer to potentiation of the synaptic weight, and the output value '1(−1)' of the second OR calculator 450 may refer to depression of the synaptic weight. Further, in the event that the output value of the first OR calculator 430 and the second OR calculator 450 is '0,' it may indicate no change to the synaptic network.

FIG. 5 illustrates an example of a spike-timing dependent plasticity (STDP) operation method of a neuromorphic system. The neuromorphic system may correspond to the neuromorphic system illustrated in FIG. 1.

Referring to FIG. 5, the STDP operation of the neuromorphic system is described.

Presuming that a firing has occurred in a neuron circuit A 509 among a plurality of neuron circuits, a WLx word line that corresponds to an axon of the neuron circuit A 509 is enabled at a falling edge of a pulse shaper signal. Further, pulse values of other neurons may be updated to the synapse circuit through the pulse shaper circuit.

For example, when IF denotes a signal informing of firing of the neuron has and PS denotes a digital pulse shape generated by the pulse shaper circuit, the IF may have '1' or '0' as a pulse value generated in the pulse generator 330 of FIG. 3. The PS may have a value of 1, −1, or 0. All neurons may each have its IF value and its PS value.

Presuming that a firing has occurred in the neuron circuit A 509, simple logic calculation may be performed with respect to the PS values of other neurons and the IF value of the neuron circuit A 509 when the falling edge of the pulse shaper signal starts. Based on a result of the logic calculation, the synapse circuit may be updated.

The foregoing operation may be performed in the STDP logic circuit 507. Whether an update has occurred among a plurality of synapse circuits and updated values of the synapse circuits may be determined based on whether the digital pulses generated in the pulse shaper circuit potentiate or depress the synaptic weight.

In addition, the STDP logic circuit 507 may determine update of the synapse circuits and the updated values, depending on a spike time between digital pulses corresponding to spikes fired by the plurality of neuron circuits.

The STDP logic circuit 507 may determine an updated value of a synapse circuit that corresponds to a first neuron circuit, based on a second digital pulse value of a second neuron seen from the falling edge of a first digital pulse.

In the event that the first digital pulse precedes the second digital pulse, the STDP logic circuit 507 may determine the updated value as a value for potentiating the synaptic weight. In the event that the second digital pulse precedes the first digital pulse, the STDP logic circuit 507 may determine the updated value as a value for depressing the synaptic weight.

In the event that a value '0' is detected at the falling edge of the first digital pulse, the STDP logic circuit 507 may determine to maintain the value of the synapse circuit corresponding to the first neuron circuit.

Hereinafter, relationships between the neuron circuit A 509 and 'other' neuron circuits is further described to explain the operation of the STDP logic circuit 507 based on an order between the first digital pulse and the second digital pulse.

For example, presuming that a firing has occurred in the neuron circuit A 509 of FIG. 5, the value of the second digital pulse of 'other' neuron circuits seen from the falling edge of the first digital pulse corresponding to the spike of the neuron circuit A 509 may occur later than that of the neuron circuit A 509. In Case 1 illustrated in FIG. 5, in the case of potentiation 510, the value '+1' may be obtained when 'other' neuron circuits are seen from the falling edge of the first digital pulse. The value '+1' refers to potentiation of the synaptic weight. The STDP logic circuit 507 may generate a pulse ($C_1C_0=00$) for potentiation update of the synaptic weight. In this example, neurons corresponding to 501 among axon lines of the neuron circuit A may be updated to a pulse value '+1' of 'other' neuron circuits. That is, $C_1C_0=00$, at the falling edge of the neuron circuit A 509.

The value of the second digital pulse of 'other' neuron circuits seen from the falling edge of the first neuron corresponding to the spike of the neuron circuit A 509 may be earlier than the neuron circuit A 509, as in Case 2 shown by depression 530. In Case 2 illustrated in FIG. 5, the value '−1' may be obtained when 'other' neuron circuits are seen from the falling edge of the first digital pulse. The value '−1' refers to depression of the synaptic weight. The STDP logic circuit 507 may generate a pulse ($C_1C_0=11$) for depression update of the synaptic weight. In this example, neurons corresponding to 503 among the axon lines of the neuron circuit A 509 may be updated to a pulse value '−1' of 'other' neuron circuits. That is, $C_1C_0=11$, at the falling edge of the neuron circuit A 509.

In addition, '0' may be obtained as the value of the second digital pulse of 'other' neuron circuits seen from the falling edge of the first neuron corresponding to the spike of the neuron circuit A 509, as illustrated in Case 3 of no change 550. In this case, a time difference between the first digital pulse and the second digital pulse is so great that the synaptic weight is not influenced at all. That is, in this case, a previous value of the synaptic weight may be maintained. Therefore, since the STDP logic circuit 507 needs to not update the synaptic weight, the value is controlled to meet $C_1C_0=01$ so that the transistors are in its OFF state. Accordingly, an SRAM value is not changed. Here, neurons corresponding to 505 among the axon lines of the neuron circuit A 509 are not changed at the falling edge of the neuron circuit A 509.

When a spike is fired at the first neuron circuit among the plurality of neuron circuits, the neuromorphic system may access the WLx line (refer to the WLx word line of FIG. 1) of the synapse circuit corresponding to the first neuron circuit at the falling edge of the first digital pulse corresponding to the fired spike, thereby enabling the WLx line.

As described above, the STDP logic circuit 507 may determine whether an update of the synapse array occurred and the updated value, and access the WLx line (refer to the WLx word line of FIG. 1) of the synapse circuit to be updated through an encoder. Here, the updated value of the corresponding synapse may be determined by $C_1C_0$ output from the STDP logic circuit.

With the various examples described above, a high integration and low-power neuromorphic system may be implemented, by flowing only a minor current equivalent to a leakage current to a neuron circuit and a synapse circuit constituting the neuromorphic system.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A synapse array based on a static random access memory (SRAM), the synapse array comprising a plurality of synapse circuits,
   wherein at least one synapse circuit among the plurality of synapse circuits comprises at least one bias transistor and at least two cut-off transistors, and the at least one synapse circuit is configured to charge a membrane node of a neuron circuit connected with the at least one synapse circuit using a sub-threshold leakage current that passed through the at least one bias transistor.

2. The synapse array of claim 1, wherein the at least one synapse circuit is configured to change a value of the SRAM using a leakage current that passed through the at least two cut-off transistors.

3. The synapse array of claim 1, wherein the neuron circuit is configured to fire a spike based on a result of comparing a number of occurrences of oscillation pulses generated based on a voltage of the membrane node to a predetermined reference number.

4. The synapse array of claim 1, wherein the neuron circuit comprises:
   a pulse generator configured to generate an oscillation pulse based on a voltage of the membrane node;
   a counter configured to count a number of occurrences of the oscillation pulse; and
   a comparator configured to compare the number of occurrences to a predetermined reference number.

5. The synapse array of claim 4, wherein the comparator is configured to compare the reference number with the number of occurrences, in synchronization with a clock signal periodically input.

6. The synapse array of claim 4, wherein
   the neuron circuit further comprises a transistor connected to a ground, and
   the oscillation pulse is used to reset the membrane node by activating the transistor.

7. The synapse array of claim 1, wherein
   the at least two cut-off transistors comprise a first cut-off transistor and a second cut-off transistor,
   the first cut-off transistor is connected to a power voltage for pull-up,
   the second cut-off transistor is connected to a ground for pull-down, and
   the at least one bias transistor is connected to the membrane node of the neuron circuit connected with the at least one synapse circuit.

8. A pulse shaper circuit configured to generate a digital pulse indicating whether pulses corresponding to spikes fired by a neuron circuit potentiate or depress a synaptic weight of a synapse circuit, comprising:
   a finite impulse response (FIR) filter comprising a 1-bit D flip flop chain configured to store the pulses;
   a first OR calculator configured to generate the digital pulse by performing OR calculation with respect to at least one pulse corresponding to potentiation of the synaptic weight among the stored pulses; and
   a second OR calculator is configured to generate the digital pulse by performing OR calculation with respect to at least one pulse corresponding to depression of the synaptic weight among the stored pulses.

9. The pulse shaper circuit of claim 8, wherein the pulse shaper circuit is configured to generate the digital pulse for maintaining the synaptic weight based on a value of the first OR calculator and a value of the second OR calculator.

10. A neuromorphic system comprising:
    a synapse array based on a static random access memory (SRAM), the synapse array comprising at least one synapse circuit;
    a neuron circuit connected with the synapse circuit, the synapse circuit being configured to charge a membrane node of the neuron circuit using a sub-threshold leakage current that passed through at least one bias transistor of the synapse array, and the neuron circuit being configured to fire spikes based on a voltage of the membrane node; and
    a pulse shaper circuit configured to generate a digital pulse corresponding to the fired spikes.

11. The neuromorphic system of claim 10, wherein the synapse array comprises a plurality of synapse circuits, the plurality of synapse circuits including the at least one synapse circuit;
    the neuromorphic system comprises a plurality of neuron circuits and a plurality of pulse shaper circuits; and
    the neuromorphic system further comprises a spike-timing dependent plasticity (STDP) logic circuit configured to determine an update state of a synapse circuit among the plurality of synapse circuits and an updated value for the synapse circuit based on a digital pulse; and
    an encoder configured to access a synapse circuit to be updated according to the digital pulse.

12. The neuromorphic system of claim 10, the neuron circuit is configured to fire spikes based on a result of comparing a number of occurrences of oscillation pulses generated based on the voltage of the membrane node to a predetermined reference number.

13. The neuromorphic system of claim 10, wherein
    the synapse array further comprises at least two cut-off transistors, and is configured to change a value of the SRAM using a leakage current that passed through the at least two cut-off transistors.

14. The neuromorphic system of claim 10, wherein the neuron circuit comprises:
    a pulse generation unit configured to generate an oscillation pulse based on the voltage of the membrane node;
    a counter configured to count a number of occurrences of the oscillation pulse; and
    a comparator configured to compare the number of occurrences to a predetermined reference number.

15. The neuromorphic system of claim 14, wherein
    the neuron circuit further comprises a transistor connected to a ground, and
    the oscillation pulse is used to reset the membrane node by activating the transistor.

16. The neuromorphic system of claim 13, wherein
    the at least two cut-off transistors comprise a first cut-off transistor and a second cut-off transistor,
    the first cut-off transistor is connected to a power voltage for pull-up,
    the second cut-off transistor is connected to a ground for pull-down, and
    the at least one bias transistor is connected to the membrane node of the neuron circuit connected with the synapse circuit.

17. The neuromorphic system of claim 11, wherein the plurality of pulse shaper circuits are configured to generate a digital pulse indicating whether pulses corresponding to spikes fired by a neuron circuit potentiate or depress a synaptic weight of the synapse circuit.

18. The neuromorphic system of claim 17, wherein the STDP logic circuit is configured to determine an update state of the plurality of synapse circuits and an updated value for the synapse circuits based on whether the digital pulse potentiates or depresses the synaptic weight.

19. The neuromorphic system of claim 18, wherein the STDP logic circuit is configured to determine the update states and the updated values of the synapse circuits, depending on a spike time between digital pulses corresponding to the spikes fired by the plurality of neuron circuits.

20. The neuromorphic system of claim 19, wherein the neuromorphic system is configured to enable a write line (WL) of a synapse circuit corresponding to a first neuron circuit at a falling edge of a first digital pulse corresponding to a spike fired by the first neuron circuit in response to the first neuron circuit among the plurality of neuron circuits firing the spike.

21. The neuromorphic system of claim 20, wherein the STDP logic circuit is configured to determine the updated value of the synapse circuit corresponding to the first neuron circuit based on a value of a second digital pulse of a second neuron seen from the falling edge of the first digital pulse.

22. The neuromorphic system of claim 21, wherein the STDP logic circuit is configured to update a value for potentiating the synaptic weight as the updated value in response to the first digital pulse preceding the second digital pulse.

23. The neuromorphic system of claim 21, wherein the STDP logic circuit is configured to update a value for depressing the synaptic weight as the updated value in response to the second digital pulse preceding the first digital pulse.

24. The neuromorphic system of claim 21, wherein the STDP logic circuit is configured to determine to maintain the value of the synapse circuit corresponding to the first neuron circuit in response to '0' being detected at the falling edge of the first digital pulse.

25. The neuromorphic system of claim 11, wherein the encoder is configured to transmit the updated value to the synapse circuits according to the digital pulse.

* * * * *